United States Patent [19]

Rice et al.

[11] Patent Number: 6,083,412
[45] Date of Patent: *Jul. 4, 2000

[54] PLASMA ETCH APPARATUS WITH HEATED SCAVENGING SURFACES

[75] Inventors: Michael Rice, Pleasanton; Jeffrey Marks, San Jose; David W Groechel, Los Altos Hills; Nicolas J Bright, Saratoga, all of Calif.

[73] Assignee: Applied Materials, Inc., Santa Clara, Calif.

[*] Notice: This patent is subject to a terminal disclaimer.

[21] Appl. No.: 09/003,867

[22] Filed: Jan. 7, 1998

Related U.S. Application Data

[62] Division of application No. 08/503,467, Jul. 18, 1995, Pat. No. 5,770,099, which is a division of application No. 08/183,060, Oct. 15, 1993, Pat. No. 5,477,975.

[51] Int. Cl.[7] .................................................. B44C 1/22
[52] U.S. Cl. .......................... 216/67; 156/345; 438/723
[58] Field of Search ................. 156/345; 118/723 E, 118/723 R, 725, 724; 216/67; 438/723, 743

[56] References Cited

U.S. PATENT DOCUMENTS

| 4,123,316 | 10/1978 | Tsuchimoto . |
|---|---|---|
| 4,261,762 | 4/1981 | King . |

(List continued on next page.)

FOREIGN PATENT DOCUMENTS

| 0 403 418 A2 | 12/1990 | European Pat. Off. . |
|---|---|---|
| 0 413 282 A2 | 2/1991 | European Pat. Off. . |
| 0 520 519 A1 | 12/1992 | European Pat. Off. . |
| 0 552 490 A1 | 7/1993 | European Pat. Off. . |
| 0 552 491 A1 | 7/1993 | European Pat. Off. . |
| 0 601 468 A1 | 6/1994 | European Pat. Off. . |
| 0 651 434 A2 | 5/1995 | European Pat. Off. . |
| 0 680 072 A2 | 11/1995 | European Pat. Off. . |
| 0 727 807 A1 | 8/1996 | European Pat. Off. . |
| 0 742 577 A2 | 11/1996 | European Pat. Off. . |
| 55-154582 | 12/1980 | Japan . |
| 57-155732 | 9/1982 | Japan . |
| 61-147531 | 12/1984 | Japan . |

(List continued on next page.)

OTHER PUBLICATIONS

Coburn, J.W., "Increasing the Etch Rate Ratio of SiO2/Si in Fluorocarbon Etching," *IBM Technical Disclosure Bulletin*, vol. 19, No. 10, Mar. 1977.

Matsuo, Seitaro, "Selective etching of SiO2 relative to Si by plasma reactive sputter etching," *J. Vac. Sc. Technology*, vol. 17, No. 2, Mar.–Apr. 1980.

European Patent Office Communication pursuant to Article 96(2) and Rule 51(2) EPC for Application No. 94307307.2–2208, mailed Jan. 17, 1996.

Patent Abstracts of Japan, Publication No. 06196446 A, Jul. 15, 1994 (NEC Corp).

Patent Abstracts of Japan, Publication No. 07288196 A, Oct. 31, 1995 (TOKYO ELECTRON Ltd).

Patent Abstracts of Japan, Publication No. 08017799 A, Jan. 19, 1996 (PLASMA SYST: KK).

Patent Abstracts of Japan, Publication No. 62052714 A, Jul. 3, 1987 (OLYMPUS Optical Co Ltd; TOAGOSEI CHEM IND CO LTD).

Patent Abstracts of Japan, Publication No. 57045927 A, Mar. 16, 1982, (Fujitsu Ltd).

*Primary Examiner*—Thi Dang
*Attorney, Agent, or Firm*—Michaelson and Wallace

[57] ABSTRACT

The invention is embodied in a method of operating a plasma etch reactor, consisting of introducing a gas into the reactor which disassociates as a plasma into an etch species which etches oxide films on a work piece in the reactor and a non-etching species combinable with the etch species into an etch-preventing polymer condensable onto the work piece below a characteristic deposition temperature, providing an interior wall comprising a material which scavenges the etching species, and maintaining a temperature of the interior wall above the deposition temperature.

33 Claims, 5 Drawing Sheets

U.S. PATENT DOCUMENTS

| | | |
|---|---|---|
| 4,350,578 | 9/1982 | Frieser et al. . |
| 4,427,516 | 1/1984 | Levinstein et al. . |
| 4,427,762 | 1/1984 | Takahashi et al. . |
| 4,430,547 | 2/1984 | Yoneda et al. . |
| 4,457,359 | 7/1984 | Holden . |
| 4,512,391 | 4/1985 | Harra . |
| 4,565,601 | 1/1986 | Kakehi et al. . |
| 4,711,698 | 12/1987 | Douglas . |
| 4,756,810 | 7/1988 | Lamont, Jr. et al. . |
| 4,786,352 | 11/1988 | Benzing . |
| 4,786,359 | 11/1988 | Stark et al. . |
| 4,793,897 | 12/1988 | Dunfield et al. . |
| 4,807,016 | 2/1989 | Douglas . |
| 4,810,935 | 3/1989 | Boswell . |
| 4,842,683 | 6/1989 | Cheng et al. . |
| 4,870,245 | 9/1989 | Price et al. . |
| 4,918,031 | 4/1990 | Flamm et al. . |
| 4,948,458 | 8/1990 | Ogle . |
| 4,990,229 | 2/1991 | Campbell et al. . |
| 5,000,113 | 3/1991 | Wang et al. . |
| 5,006,220 | 4/1991 | Hijikata et al. . |
| 5,015,330 | 5/1991 | Okumura et al. . |
| 5,074,456 | 12/1991 | Degner et al. . |
| 5,085,727 | 2/1992 | Steger . |
| 5,169,487 | 12/1992 | Langley et al. . |
| 5,187,454 | 2/1993 | Collins et al. . |
| 5,203,956 | 4/1993 | Hansen . |
| 5,241,245 | 8/1993 | Barnes et al. . |
| 5,249,251 | 9/1993 | Egalon et al. . |
| 5,258,824 | 11/1993 | Carlson et al. . |
| 5,276,693 | 1/1994 | Long et al. . |
| 5,277,751 | 1/1994 | Ogle . |
| 5,326,404 | 7/1994 | Sato . |
| 5,346,578 | 9/1994 | Benzing et al. . |
| 5,349,313 | 9/1994 | Collins et al. . |
| 5,392,018 | 2/1995 | Collins et al. . |
| 5,399,237 | 3/1995 | Keswick et al. . |
| 5,401,350 | 3/1995 | Patrick et al. . |
| 5,414,246 | 5/1995 | Shapona . |
| 5,423,945 | 6/1995 | Marks et al. . |
| 5,477,975 | 12/1995 | Rice et al. . |
| 5,514,246 | 5/1996 | Blalock . |
| 5,529,657 | 6/1996 | Ishii . |
| 5,556,501 | 9/1996 | Collins et al. . |

FOREIGN PATENT DOCUMENTS

| | | |
|---|---|---|
| 61-91377 | 5/1986 | Japan . |
| 61-142744 | 6/1986 | Japan . |
| 62-12129 | 1/1987 | Japan . |
| 62-254428 | 11/1987 | Japan . |
| 63-9120 | 1/1988 | Japan . |
| WO 92/20833 | 11/1992 | WIPO . |

PLASMA ETCH APPARATUS WITH HEATED SCAVENGING SURFACES

This is a divisional of prior application Ser. No. 08/503,467 filed Jul. 18, 1995, now U.S. Pat. No. 5,770,099, which is a divisional application of prior application Ser. No. 08/138,060 filed Oct. 15, 1993, now U.S. Pat. No. 5,477,975.

BACKGROUND OF THE INVENTION

1. Technical Field

The invention is related to RF plasma etch reactors capable of high selectivity between etching of oxide films (such as silicon dioxide) and non-oxide surfaces (such as polysilicon or silicon nitride films).

2. Background Art

European Patent Document No. 0,520,519 A1 discloses a novel inductively coupled plasma etch reactor for etching thin films formed on a silicon wafer using an RF plasma etch process, the disclosure of which is incorporated herein by reference. Such a reactor can be used to selectively etch silicon dioxide over non-oxide (e.g., silicon nitride) films on the wafer. Specifically, a carbon-fluorine gas such as $C_2F_6$ is excited sufficiently to generate a plasma within the reactor chamber, producing ions and free radicals including F and $CF_3$, for example. The F radicals etch any silicon dioxide film on the wafer, while carbon and fluorine atoms or ions in the plasma combine on the wafer surface to form a polymer. The polymer disassociates when formed on silicon dioxide surfaces due to the effect of oxygen freed from the silicon dioxide film during the etch process, and due to effect of fluorine in the plasma. However, when formed on a non-oxide film (e.g., silicon nitride), the polymer accumulates due to the lack of oxygen in the underlying non-oxide film, this formation inhibiting etching of the underlying non-oxide film, thereby providing a pronounced etch selectivity of the oxide film over the non-oxide film. This selectivity is of great advantage when etching vias through a silicon dioxide layer overlying a non-oxide layer (e.g., polysilicon) which is not to be etched. The selectivity is limited if the polymer formed over the polysilicon layer contains more than 40% fluorine by weight, because such polymers are susceptible to being attacked by fluorine in the plasma, and therefore provide only limited protection to the underlying polysilicon layer.

U.S. patent application Ser. No. 07/941,501 filed Sep. 8, 1992 by Marks et al. entitled "Selectivity for Etching an Oxide Over a Nitride" discloses how to use an inductively coupled plasma reactor of the type disclosed in the above-referenced European Patent Document to form a carbon polymer film having less than 40% fluorine over a non-oxide (i.e., silicon nitride) film. This improvement is realized by increasing the proportion of carbon in the plasma relative to fluorine, and is accomplished by introducing a fluorine scavenger into the plasma. One such scavenger is silane gas, for example. The silicon in the silane gas combines with free fluorine atoms in the plasma to form $SF_4$ gas, which is readily pumped out of the reactor chamber. The effect of this improvement is that the carbon-rich polymer formed over the silicon nitride film is impervious to fluorine in the plasma and thereby provides a virtually infinite selectivity of silicon dioxide etch rate to silicon nitride etch rate.

U.S. patent application Ser. No. 07/984,045 filed Dec. 1, 1992 by Collins et al. and U.S. patent application Ser. No. 07/941,507 filed Sep. 8, 1992 by Collins et al. disclose, respectively, a capacitively and an inductively coupled plasma etch apparatus in which a fluorine scavenger material is introduced into the reactor chamber to achieve the same type of advantages as realized in the above-referenced Marks et al. application. This material is in the form of a silicon ceiling inside the reactor chamber. The silicon ceiling emits silicon atoms into the plasma which scavenge fluorine out of the plasma, providing the desired carbon-to-fluorine ratio in the plasma to form a carbon-rich polymer impervious to fluorine in the plasma over the non-oxide (e.g., silicon nitride) film.

The problem with the foregoing techniques is that in many types of reactors, particularly the inductively coupled reactors of the type disclosed in the above-referenced European Patent Document, the chamber side walls are preferably formed of quartz (silicon dioxide) because the silicon dioxide atoms on the wall surface etch to provide silicon and oxygen atoms. The silicon atoms scavenge fluorine out of the plasma, with the desired effects described above. To a lesser extent, the oxygen atoms combine with carbon atoms in the plasma to scavenge carbon, but this is a minor effect.

Figure 1:
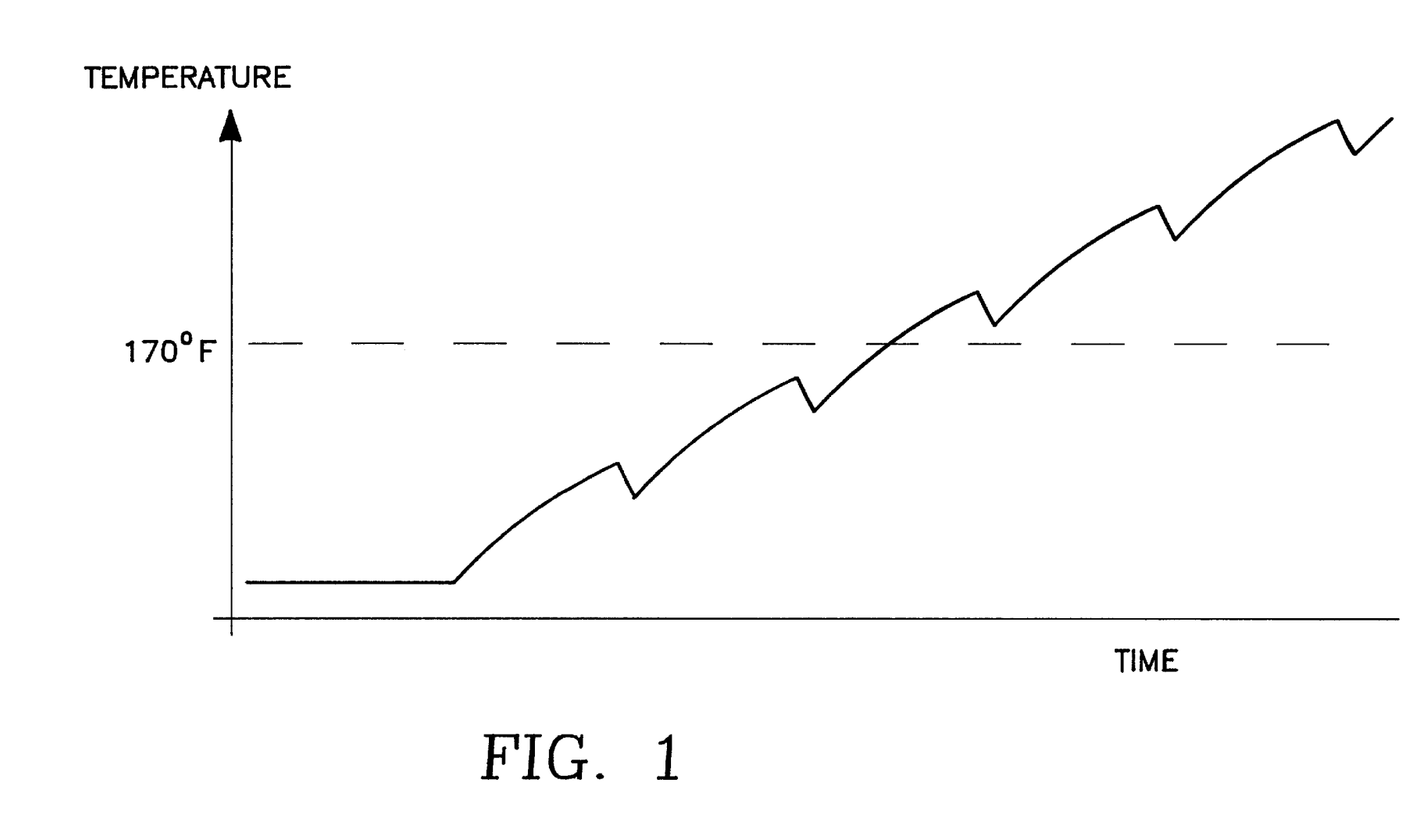
FIG. 1 is a graph illustrating the side wall temperature as a function of time in an inductively coupled plasma reactor of the type antedating the discovery of the present invention.

The quartz side walls are susceptible to cooling each time the reactor is idled and the plasma turned off, which is typical whenever a new cassette of wafers is introduced or whenever the chamber must be opened for maintenance, for example. The side walls typically fall below 170 degrees C., which is the deposition temperature below which the carbon-fluorine polymer condenses. As soon as the plasma is ignited again, the carbon-fluorine polymer formed from the plasma condenses very rapidly onto the now-cool quartz side walls, forming a very thick polymer coating. As each wafer is cycled through the chamber, the temperature of the side wall climbs, dropping slightly and temporarily as the plasma is turned off briefly with the introduction of each new wafer, but making steady overall progress upward to its stead-state temperature, as illustrated in FIG. 1. In the meantime, because the quartz side wall is attracting so much of the polymer, very little is available to protect the non-oxide (e.g., polysilicon or silicon nitride) film on the wafer from being etched, and so the oxide-to-non-oxide etch selectivity is below the required level during the processing of the first several wafers.

Eventually, the temperature of the quartz side wall climbs above 170 degrees C., and the thick polymer coating suddenly vaporizes from the now-hot side wall and covers the new wafer currently being processed in the reactor chamber, interfering with the etch process.

One way around the foregoing problem is to delay the introduction of production wafers into the chamber until the quartz side wall temperature is well-above 170 degrees C., but such an expedient involves an unacceptable loss of time as well as loss of materials (i.e., the silicon and quartz scavenging materials inside the reactor chamber). Accordingly there is a need to solve the foregoing problem without loss of production time and without waste of chamber materials.

SUMMARY OF THE DISCLOSURE

The invention is embodied in a plasma etch reactor in which a gas is introduced which disassociates as a plasma into an etch species which etches oxide films on a work piece in the reactor and a non-etching species combinable with the etch species into an etch-preventing polymer condensable onto the work piece below a characteristic deposition temperature, the reactor including an interior wall comprising a material which scavenges the etching species, there being means provided for maintaining a temperature of the interior wall above the deposition temperature. Increasing the wall temperature above the deposition temperature increases the etch rate of the hot quartz surface, which scavenges fluorine and increases the etch selectivity of the oxide film over the oxide-free under-layer.

DETAILED DESCRIPTION OF THE PREFERRED EMBODIMENT

The problem of deposition and vaporization of polymer on the quartz side wall is eliminated without any loss of productivity and without waste of any chamber materials by a thermal control system including a cooling device with greater capacity than the heat flow from the plasma and a heating device controlling the temperature of the side walls and having greater capacity than the cooling device. The side wall heating device is regulated to maintain the temperature of the quartz side walls above the polymer condensation temperature of 170 degrees C. whenever the reactor is idle. In order to minimize the temperature increase on the inside surface of the quartz wall when the plasma is ignited, the heating device stops heating the quartz side wall immediately upon ignition of the plasma. In regulating the quartz side wall temperature, the heating device employs a feedback control loop responding to a temperature sensor attached to the quartz side wall. For simplicity, the temperature sensor is attached to the outer surface of the quartz side wall and the heating device maintains a predetermined temperature gradient between the interior and exterior side wall surfaces.

Figure 2:
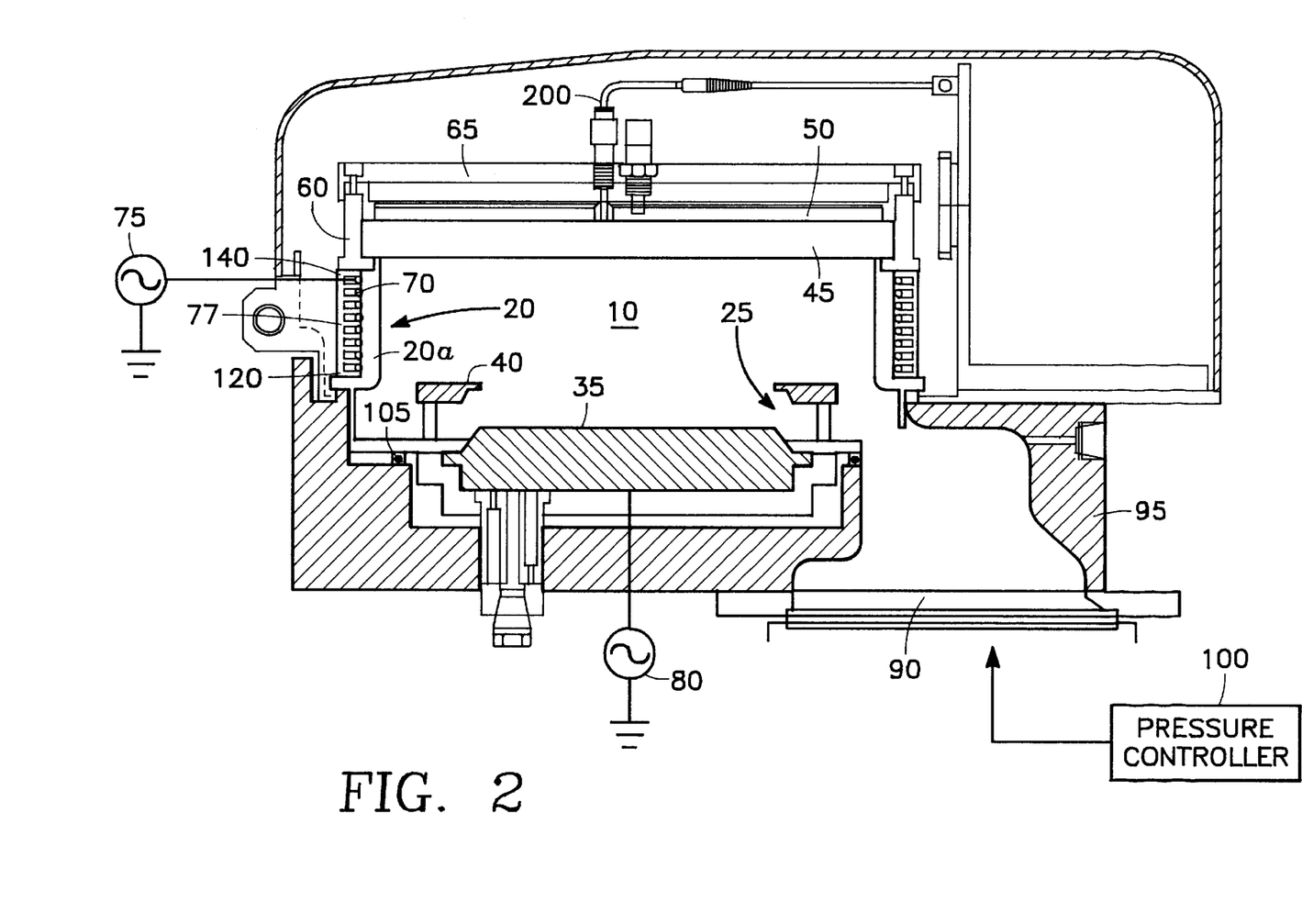
FIG. 2 is a simplified diagram of an inductively coupled plasma reactor embodying the present invention.
Figure 3:
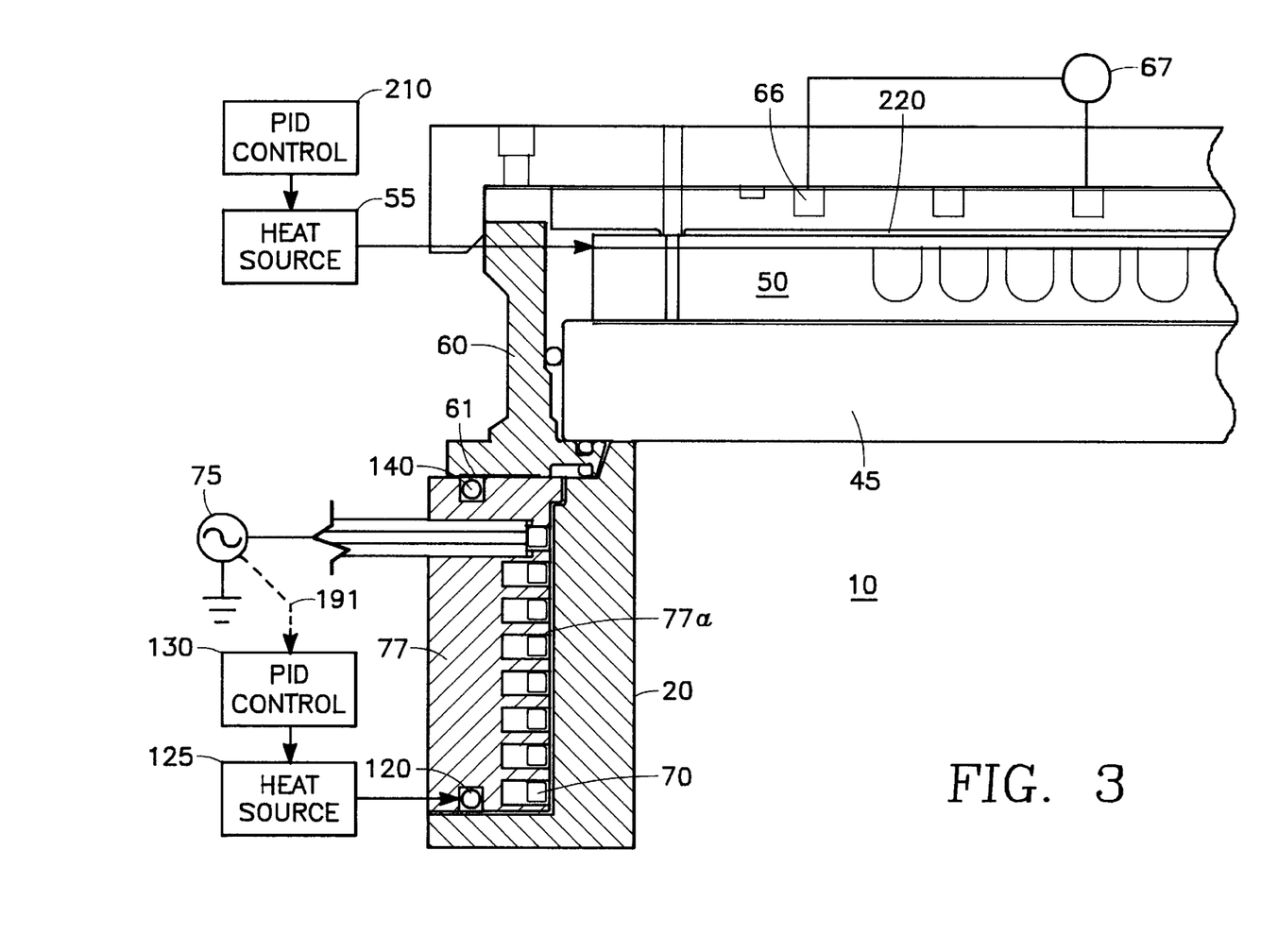
FIG. 3 is a detailed diagram of a portion of the reactor of FIG. 2.

Referring to FIG. 2, an inductively coupled plasma reactor of the general type described in the above-referenced European Patent Document includes a vacuum chamber 10 enclosed by a cylindrical quartz side wall 20, a bottom 25 including a cathode assembly on which a silicon wafer 35 is held by a retractable annular holder 40. The ceiling 45 is crystalline silicon heated by an overlying heating element 50 connected to a temperature-controlling heat source 55. A cylindrical aluminum top wall 60 rests on a 0.025 cm-thick polyamide pad 61 on the quartz side wall 20 and supports an overlying discoid cooling element 65 in which coolant is circulated through water jackets 66 by a pump 67 as shown in FIG. 3. This cools the quartz side wall 20 through the aluminum cylindrical top wall 60.

A helical cylindrical antenna coil 70 is wrapped around the cylindrical quartz side wall 20 and is connected to an RF energy source 75 providing the inductive coupling energy to the plasma in the chamber 10. A ceramic cylindrical cover 77 such as $Al_2O_3$ or $Si_3N_4$ surrounds the antenna coil 70. The cathode assembly 30 is connected to an RF bias source 80, which furnishes the bias energy to the wafer 35.

A gate valve/vacuum pump assembly 90 draws gas from the chamber 10 through an opening in the chamber body 95 to maintain a vacuum in the chamber 10 determined by a pressure control device 100. A gas feed 105 feeds gases such as $C_2F_6$ into the chamber 10.

In order to maintain the temperature of the interior surface 20a of the quartz sidewall 20 well-above 170 degrees C., a heating element 120 best shown in FIG. 3 rests in the interior of the ceramic cover 77 near the bottom of the quartz side wall 20 and is connected to an electrical source 125 shown in FIG. 2. The heating element 120 is preferably a cable heater manufactured by Watlow, Inc., 12001 Lackland Road, St. Louis, Mo. If the chamber 10 is large enough to hold an 8-inch wafer, then the cable heater is approximately 45 inches long and is wrapped in a circle, with its sheath electrically grounded. Preferably, it is operated by applying 1100 watts at 208 volts. In order to avoid electromagnetic interference with the plasma, the two ends of the cable heater do not touch but instead are separated by preferably about 2.5 cm. Alternatively, a second heating element or cable heater 140 may be placed near the top of the quartz side wall 20, in which case each cable heater 120, 140 is operated at 550 watts.

In order to provide accurate temperature control of the quartz side wall 20, a temperature sensor such as a thermocouple 190 mounted on the outer surface of the ceramic cover 77 surrounding the quartz side wall 20 is connected to an input of the temperature controller 130. Typically, there is a temperature gradient of about 30 to 40 degrees C. between the interior surface of the quartz side wall 20 and the exterior surface of the ceramic cover 77. The controller 130 is programmed to maintain the outer surface of the ceramic cover 77 at about 200 degrees C. when the system is idle. When plasma is ignited, heat is transferred into and through the quartz side wall 20, through a small air gap 77a (typically 0.0075 cm) and into the ceramic cover 77. In the preferred embodiment, the heater 120 is turned off (by switching off from the heat source 125) as long as there is a plasma in the chamber 10. This allows the temperature of the ceramic cover 77 to fall slightly, which minimizes the increase in temperature of the inside surface of the quartz side wall 20. In a preferred embodiment, the temperature controller 130 is a conventional PID (proportional integral differential) controller which is readily programmed by the skilled worker.

The PID controller 130 is preferably programmed to turn off electrical power to the cable heater 120 (and 140) whenever the plasma is ignited in the chamber 10 and to turn on electrical power to the cable heater 120 (and 140) as soon as the plasma is turned off as sensed via a control line 191 from the RF generator 75.

A necessary condition for stable temperature control of the quartz side wall 20 is that the heat flow from the plasma in the chamber 10 through the quartz side wall 20 must be less than the heat flow from the cooling provided by the coolant circulator 67, which in turn must be less than the heat flow from the heating element 120. Heat flow between the interior surface of the quartz side wall 20 and the outer surface of the ceramic cover 77 is set by conduction through the air gap 77a therebetween. The air gap 77a exhibits in a preferred embodiment a thermal conductivity of about 0.02 watts per meter-degree C., the thermal conductivities of the quartz side wall 20 and ceramic cover 77 being 1.5 and 20 watts per meter-degrees C., respectively. Heat flow from the quartz side wall 20 and cooling top 65 is set by conduction through a 0.025 centimeter thick polyamide pad 61 between the top of the ceramic cover 77 and the bottom of the cooling top 65. Because the quartz side wall 20 is physically remote from the cooling device 65, the heat source 125 is turned off whenever the plasma is ignited in the chamber 10 to reduce the temperature rise to between 10 and 20 degrees C. on the inside surface of the quartz wall 20.

The temperature of the silicon ceiling 45, as noted above, determines the rate at which silicon atoms are emitted therefrom into the plasma within the chamber 10, and therefore affects the carbon-to-fluorine content ratio. Accordingly, the silicon ceiling 45 is maintained at a temperature corresponding to a carbon/fluorine plasma ratio providing a polymer carbon content greater than 60% by weight. Such temperature control of the ceiling 45 is provided by a conventional PID controller 210 governing the ceiling heat source 55 in accordance with a signal received from a temperature sensor or thermocouple 200 attached to the silicon ceiling 45. The PID controller 210 is readily programmed by the skilled worker to maintain the silicon ceiling at the requisite temperature for a given carbon-content of the polymer formed on non-oxide (e.g., polysilicon or silicon nitride) surfaces on the wafer 35. Heat conduction to the silicon ceiling 45 is set by a suitable air gap 220 between the heater 50 and the ceiling 45 similar to the air gap 77a. A necessary condition for stable temperature control of the silicon ceiling 45 is that the heat flow from the plasma in the chamber 10 through the ceiling 45 must be less than the heat flow from the cooling provided by the coolant circulator 67, which in turn must be less than the heat flow from the heating element 50. Accordingly, in a preferred embodiment, the heater 50 provides 4500 watts while 2500 watts of cooling is available to the ceiling from the cooling device 65. The plasma in the chamber 10 generates only 1500 watts of heat in the ceiling, and therefore the temperature control loop comprising the PID controller 210 is capable of regulating the silicon ceiling temperature at all times, even when a plasma is ignited in the chamber 10.

WORKING EXAMPLE

In one example, the inductively-coupled RF source 75 produced 2800 watts at 2 MHz, the bias RF source 80 produced 1400 watts at 1.8 MHz, the heat source 55 was set to maintain the temperature of the silicon ceiling 50 at 260 degrees C., the heat source 125 was set to maintain the temperature of the inside surface of the quartz wall at 200 degrees C., and the flow of $C_2F_6$ through the gas feed was 35 standard cubic centimeters per minute in a reactor chamber of 17 liters (including the portion up to the gate valve/vacuum pump assembly 90) at a chamber pressure of 5 milliTorr.

Generally, the source RF power of the RF source 75 is in the range of 2000 to 3000 watts at about 2 MHz, the bias RF power of the RF source 80 is in the range of 500 to 1500 watts at 1.8 MHz (depending upon the size of the wafer 35), the silicon roof temperature is in the range of 200 to 300 degrees C., the quartz side wall interior surface temperature is in a range between 170 and 230 degrees C., the $C_2F_6$ gas flow rate is between 20 and 50 standard cubic centimeters per minute and the chamber pressure is between 1 and 10 milliTorr.

If the temperature of the quartz wall 20 is varied from 210 to 225 degrees C., then the etch selectivity ratio of oxide to polysilicon increases from about 15 to 19 while the oxide etch rate decreases by about 10%. The oxide etch rate decreases because the increased temperature of the quartz wall 20 provides more silicon atoms to scavenge fluorine for an enriched and therefore impervious polymer coating on the underlying polysilicon layer, but less fluorine for etching the overlying oxide.

Figure 4:
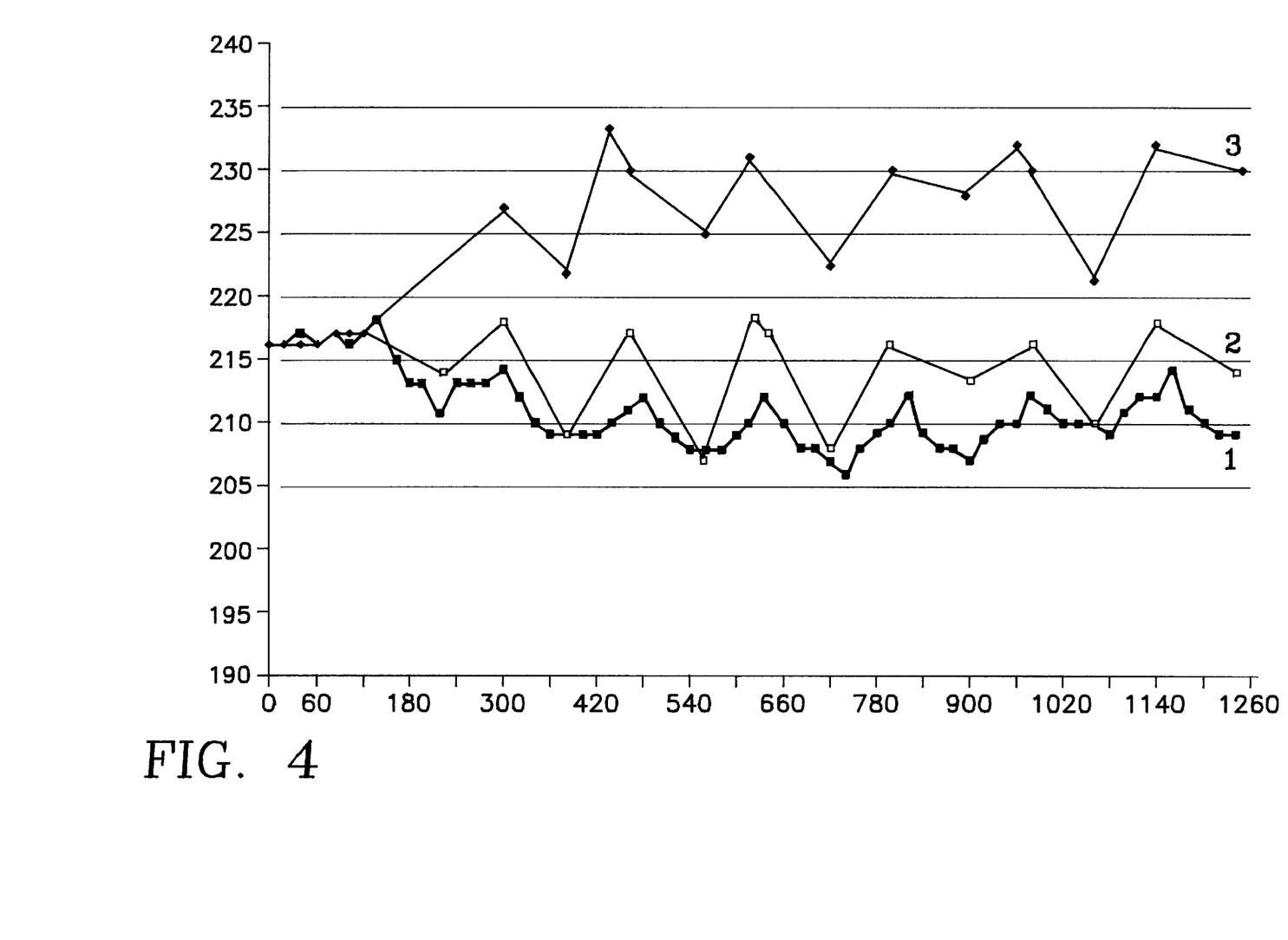
FIG. 4 is a graph of temperature as a function of time at three distinct locations indicated in FIG. 3.
Figure 5:
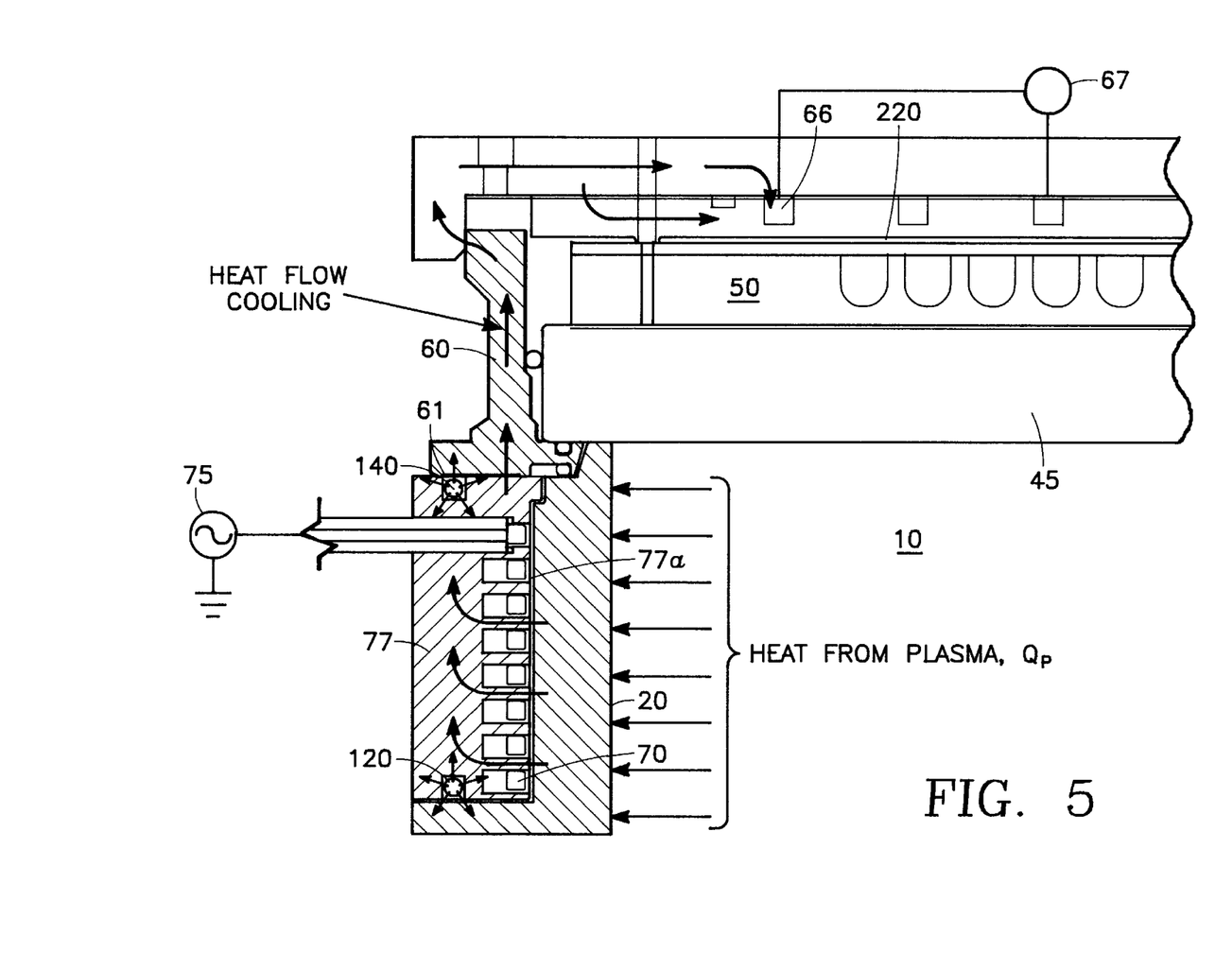
FIG. 5 is a diagram illustrating thermal conduction paths in the apparatus of FIG. 3.

FIG. 4 is a graph illustrating the temperature stability achieved by the present invention, showing the temperature as a function of time at three locations on the quartz side wall 20 numbered 1, 2, 3, respectively in FIG. 3. The quartz side wall temperature idles at about 216 degrees C. while the reactor is idle (during the first 60 seconds of the graph of FIG. 4), and then fluctuates as the plasma is re-ignited with each new wafer being processed. The data reflects a period of 45 seconds of loading without a plasma and 90 seconds of plasma processing for the first six wafers being processed. After that, there is an extended idle time while the wafer cassette is changed or the chamber is cleaned. FIG. 5 illustrates various heat conduction paths in the apparatus of FIG. 3.

While the invention has been described in detail by specific reference to preferred embodiments thereof, it is understood that variations and modifications thereof may be made without departing from the true spirit and scope of the invention.

What is claimed is:

1. A method of operating a plasma reactor, comprising:
   introducing a gas into a processing chamber of said reactor which disassociates as a plasma into an etching species which is capable of etching films on a workpiece in the reactor and a non-etching species which is a precursor of a material condensable as an etch-preventing layer on surfaces of the workpiece;
   providing at least one of (i) an interior wall of said chamber, and (ii) an article disposed within the chamber, wherein each comprises a material which scavenges said etching species; and
   maintaining a temperature of said at least one of (i) the interior wall of said chamber, and (ii) the article disposed within the chamber, at a temperature corresponding to a desired content ratio of said non-etching species and said etching species in said plasma.

2. The method of claim 1 wherein the desired content ratio in said plasma corresponds to a content ratio of said non-etching species in said material condensable as the etch-preventing layer at which this material is substantially impervious to attack by said etching species in said plasma.

3. The method of claim 1 wherein said material which scavenges comprises a silicon-containing material.

4. The method of claim 1 wherein said etching species comprises a carbon and fluorine containing gas and the etch-preventing material is a polymer comprised of carbon and fluorine.

5. The method of claim 1 wherein the maintaining step comprises maintaining said temperature in a range from about 170 to about 230 degrees Celsius.

6. The method of claim 1 wherein the maintaining step comprises maintaining said temperature in a range from about 200 to about 300 degrees Celsius.

7. The method of claim 1 wherein the step of providing comprises providing both an interior wall of said chamber and an article disposed within the chamber comprising materials which scavenge said etching species.

8. The method of claim 7 wherein the maintaining step comprises maintaining the interior wall in a range from about 170 to about 230 degrees Celsius and maintaining the article in a range from about 200 to about 300 degrees Celsius.

9. The method of claim 7 wherein the said interior wall comprises one of crystalline silicon or quartz.

10. The method of claim 7 wherein the said article comprises one of crystalline silicon or quartz.

11. The method of claim 1 wherein the maintaining step comprises transferring heat to said at least one of (i) the interior wall of said chamber, and (ii) the article disposed within said chamber.

12. The method of claim 1 wherein the maintaining step comprises cooling said at least one of (i) the interior wall of said chamber, and (ii) the article disposed within said chamber.

13. The method of claim 1 wherein the maintaining step comprises cooling and transferring heat to said at least one of (i) the interior wall of said chamber, and (ii) the article disposed within said chamber.

14. A plasma etch reactor comprising:
a vacuum chamber having an interior wall into which a gas is introduced which disassociates as a plasma into an etch species which etches films on a work piece in the reactor and a non-etching species combinable with the etch species into an etch-preventing material condensable onto said interior wall and the work piece below a characteristic deposition temperature; and
a temperature control apparatus capable of maintaining a temperature of said interior wall above said characteristic deposition temperature of said etch-preventing material to control condensation of said material on said interior wall, said temperature control apparatus operating only when said plasma is not present in the vacuum chamber.

15. The reactor of claim 14 wherein said temperature control apparatus comprises:
a heater for adding heat energy to said interior wall;
control circuitry capable of applying sufficient power to said heating element so as to maintain the temperature of said interior wall above said characteristic deposition temperature.

16. The reactor of claim 15 further comprising:
a signaling device capable of signaling said control circuitry to stop whenever a plasma is ignited in said reactor.

17. The reactor of claim 15 wherein said control circuitry comprises:
a sensor for sensing a temperature of a portion of said reactor near said interior wall; and
a processor capable of determining said sufficient power proportional to a difference between the temperature sensed by said sensor and a prescribed temperature, said prescribed temperature being above said characteristic deposition temperature.

18. The reactor of claim 17 wherein said portion is an outer surface of said reactor adjacent said interior wall.

19. The reactor of claim 15 wherein the control circuitry maintains the temperature of the interior wall above the characteristic deposition temperature of the etch-preventing polymer by a prescribed number of degrees.

20. The reactor of claim 18 wherein said reactor comprises an inductively coupled reactor having a cylindrical helical RF antenna surrounding a chamber of said reactor, and wherein said interior wall comprises a cylindrical quartz side wall supporting said antenna.

21. The reactor of claim 20 wherein said temperature control apparatus comprises a circular heating wire near and surrounding said cylindrical quartz side wall.

22. The reactor of claim 14 wherein the gas introduced into the reactor is a carbon and fluorine containing gas and the etch-preventing material is a polymer comprised of carbon and fluorine.

23. The reactor of claim 22 wherein the characteristic deposition temperature is about 170 degrees Celsius.

24. The reactor of claim 14 wherein said interior wall comprises a material which scavenges said etching species.

25. The reactor of claim 24 wherein said etching species comprises a carbon and fluorine containing gas and the etch-preventing material is a polymer comprised of carbon and fluorine.

26. The reactor of claim 25 wherein said material which scavenges comprises a silicon-containing material.

27. The reactor of claim 26 wherein the temperature control apparatus maintains the temperature of said interior wall in a range from about 170 to about 230 degrees Celsius.

28. The reactor of claim 24 further comprising:
an article disposed within the vacuum chamber and containing a material which scavenges said etchant species; and
a second temperature control apparatus for maintaining a temperature of said article at a temperature corresponding to a desired content ratio of said non-etching species and said etching species in said plasma.

29. The reactor of claim 28 wherein said etching species comprises a carbon and fluorine containing gas and the etch-preventing material is a polymer comprised of carbon and fluorine.

30. The reactor of claim 29 wherein said material which scavenges comprises a silicon-containing material.

31. The reactor of claim 30 wherein the second temperature control apparatus maintains the temperature of said article in a range from about 200 to about 300 degrees Celsius.

32. The reactor of claim 28 wherein the said interior wall comprises one of crystalline silicon or quartz.

33. The reactor of claim 28 wherein the said article comprises one of crystalline silicon or quartz.

* * * * *